(12) United States Patent
Hogan et al.

(10) Patent No.: US 10,917,050 B2
(45) Date of Patent: Feb. 9, 2021

(54) AMPLIFIER POWER CONVERTER INPUT CURRENT/POWER LIMIT ADJUSTMENT USING AMPLIFIER LOAD DETERMINATIONS

(71) Applicant: Apple Inc., Cupertino, CA (US)

(72) Inventors: Roderick B. Hogan, San Francisco, CA (US); Evan D Ragsdale, Milpitas, CA (US); Kavitha Srinivasan, Saratoga, CA (US)

(73) Assignee: APPLE INC., Cupertino, CA (US)

( * ) Notice: Subject to any disclaimer, the term of this patent is extended or adjusted under 35 U.S.C. 154(b) by 20 days.

(21) Appl. No.: 16/194,039

(22) Filed: Nov. 16, 2018

(65) Prior Publication Data

US 2020/0106393 A1 Apr. 2, 2020

Related U.S. Application Data

(60) Provisional application No. 62/738,466, filed on Sep. 28, 2018.

(51) Int. Cl.
| | |
|---|---|
| *H03F 1/02* | (2006.01) |
| *H03F 3/187* | (2006.01) |
| *H03F 3/217* | (2006.01) |
| *H03F 3/21* | (2006.01) |

(Continued)

(52) U.S. Cl.
CPC .......... *H03F 1/0238* (2013.01); *H02M 3/158* (2013.01); *H03F 3/187* (2013.01); *H03F 3/211* (2013.01); *H03F 3/213* (2013.01); *H03F 3/2171* (2013.01); *H03F 2200/03* (2013.01); *H03F 2200/33* (2013.01); *H03F 2200/387* (2013.01); *H03F 2200/462* (2013.01); *H03F 2200/471* (2013.01); *H03F 2200/481* (2013.01); *H03F 2203/21139* (2013.01)

(58) Field of Classification Search
USPC ............................... 330/251, 10, 207 A, 297
See application file for complete search history.

(56) References Cited

U.S. PATENT DOCUMENTS

| | | | |
|---|---|---|---|
| 10,116,215 B2 * | 10/2018 | Swanson | H02M 3/1582 |
| 10,361,659 B2 * | 7/2019 | Henzler | H03F 1/0227 |

(Continued)

OTHER PUBLICATIONS

Class-D Amplifier Design Basics II, Chapter 2; International IOR Rectifier Feb. 19, 2009; 74 pages.

*Primary Examiner* — Hieu P Nguyen
(74) *Attorney, Agent, or Firm* — Womble Bond Dickinson (US) LLP

(57) ABSTRACT

A power converter produces power at a greater voltage than provided by a power source, while drawing power from the power source, wherein the power converter has a variable input current limit or a variable input power limit. One or more audio amplifiers are configured into i) drawing power from the power source bypassing the power converter and ii) drawing power from the power converter, according to audio signal amplitude, during audio playback and in accordance with an audio signal being amplified. A load of each amplifier is determined for when the amplifier is drawing power from the power source bypassing the power converter. The variable input limit of the power converter is adjusted in accordance with the determined load, during the audio playback. Other aspects are also described and claimed.

20 Claims, 4 Drawing Sheets

(51) Int. Cl.
*H03F 3/213* (2006.01)
*H02M 3/158* (2006.01)

(56) References Cited

U.S. PATENT DOCUMENTS

2008/0265822 A1* 10/2008 Menegoli .................. H02P 7/29
　　　　　　　　　　　　　　　　　　　318/569
2015/0200640 A1　　 7/2015　Hogan et al.

* cited by examiner

AMPLIFIER POWER CONVERTER INPUT CURRENT/POWER LIMIT ADJUSTMENT USING AMPLIFIER LOAD DETERMINATIONS

This application claims priority to U.S. patent application No. 62/738,466 filed on Sep. 28, 2018, the disclosure of which is incorporated in its entirety by reference herein.

FIELD

An embodiment of the invention relates to audio power amplifier systems, and in particular battery powered audio amplifier systems. Other embodiments are also described.

BACKGROUND

To achieve louder sound output simultaneously with improved power efficiency from battery powered consumer electronic audio devices, such as smart phones, laptop computers and tablet computers, a switching or class D audio amplifier in conjunction with a battery powered boost converter that supplies power to the amplifier, is typically used. This approach offers more amplifier output power than would be possible using the battery voltage directly (to supply the amplifier.) A current limit is often used to limit input power to such a boost converter, to reduce the likelihood of a system hazard such as too much power is being drawn from the battery (due to for example a power spike in the audio subsystem coinciding with power spikes in other system components that are being fed by the battery, e.g., a graphics processing unit.) Of course, operating the audio amplifier from the boosted supply voltage results in higher quiescent power consumption (e.g., while there is essentially no sound output for a listener to hear) and increased switching losses. To mitigate such inefficiencies, the audio amplifier may have an II-bridge design that is dynamically configured to operate in two modes, either from the lower voltage of the battery (greater efficiency) or from the boosted supply voltage (greater power output), depending on whether or not a supply voltage higher than the battery voltage is needed during audio playback.

SUMMARY

A battery powered boost converter may have an energy reservoir at its output that supplies the audio amplifier with bursts of energy as needed during audio playback (due to the peaky nature of speech and music signals.) As a result, the voltage on the boost converter output sags often (and as such is not a regulated dc voltage.) The boost converter responds automatically to replenish such energy deficits, by drawing power from the battery up to the converter input current limit. But it has been discovered that this may happen even when the audio amplifier has transitioned into the low voltage mode of operation in which the amplifier is being supplied by the battery directly. This is also referred to as a situation where the amplifier load is bypassing the boost converter, because there is no need for the boosted supply voltage (at that moment of audio playback.) Unfortunately, this is a situation where total power draw from the battery (by the audio subsystem) may exceed that of the converter input limit. In some instances, it is desirable to maintain a constant power draw on the battery, by the audio subsystem, regardless of whether the audio amplifier is operating in low voltage mode or in high voltage (boosted) mode.

One way to mitigate the above situation is to force the audio amplifier to operate in low voltage mode less often, e.g., by lowering the threshold above which the audio amplifier is switched to the high voltage (boosted) mode. This allows the converter input current limit to play a larger role in the total draw of the audio subsystem. But this results in higher power consumption from the battery since the amplifier has lower efficiency during the high voltage mode.

An aspect of the disclosure here is a technique that decouples the transitioning of the audio amplifier into different (low and high) supply voltage modes, from the goal of not exceeding a total supply power budget or total supply current budget that has been allocated to the audio subsystem. More specifically, an audio amplifier system is described that has a power converter having an input current limit or input power limit on current on power that the power converter is allowed to draw from a power source. The audio amplifier is arranged to configure itself into drawing its supply power i) from the power source bypassing the power converter and ii) from the power source via the power converter. A control circuit determines a load of the audio amplifier while the audio amplifier is drawing its supply power from the power source and, based on the load determined by the control circuit, adjusts the input current limit or input power limit of the power converter. Using such a technique, the input current limit or input power limit of the power converter may be reduced (during audio playback) so that total supply power or total supply current drawn from the battery by the audio amplifier subsystem, remains within a total current budget or a total power budget for the audio subsystem. For example, if the amplifier happens to operate in the low voltage mode more often, following short bursts in the high voltage mode during which the energy reservoir of the power converter is depleted, the total power budget nevertheless remains unchanged during those low voltage modes despite the power converter hitting its input current limit. That is because the input current limit has been reduced, based on the determined load on the amplifier (and more accurately, based on a determination of how much power draw from the battery (due to the audio subsystem) is bypassing the power converter (in that moment in time.)

The above summary does not include an exhaustive list of all aspects of the present disclosure. It is contemplated that the disclosure includes all systems and methods that can be practiced from all suitable combinations of the various aspects summarized above, as well as those disclosed in the Detailed Description below and particularly pointed out in the Claims section. Such combinations may have particular advantages not specifically recited in the above summary.

BRIEF DESCRIPTION OF THE DRAWINGS

Several aspects of the disclosure here are illustrated by way of example and not by way of limitation in the figures of the accompanying drawings in which like references indicate similar elements. It should be noted that references to "an" or "one" aspect in this disclosure are not necessarily to the same aspect, and they mean at least one. Also, in the interest of conciseness and reducing the total number of figures, a given figure may be used to illustrate the features of more than one aspect of the disclosure, and not all elements in the figure may be required for a given aspect.

DETAILED DESCRIPTION

Several aspects of the disclosure with reference to the appended drawings are now explained. Whenever the shapes, relative positions and other aspects of the parts described are not explicitly defined, the scope of the invention is not limited only to the parts shown, which are meant merely for the purpose of illustration. Also, while numerous details are set forth, it is understood that some aspects of the disclosure may be practiced without these details. In other instances, well-known circuits, structures, and techniques have not been shown in detail so as not to obscure the understanding of this description.

Figure 1:
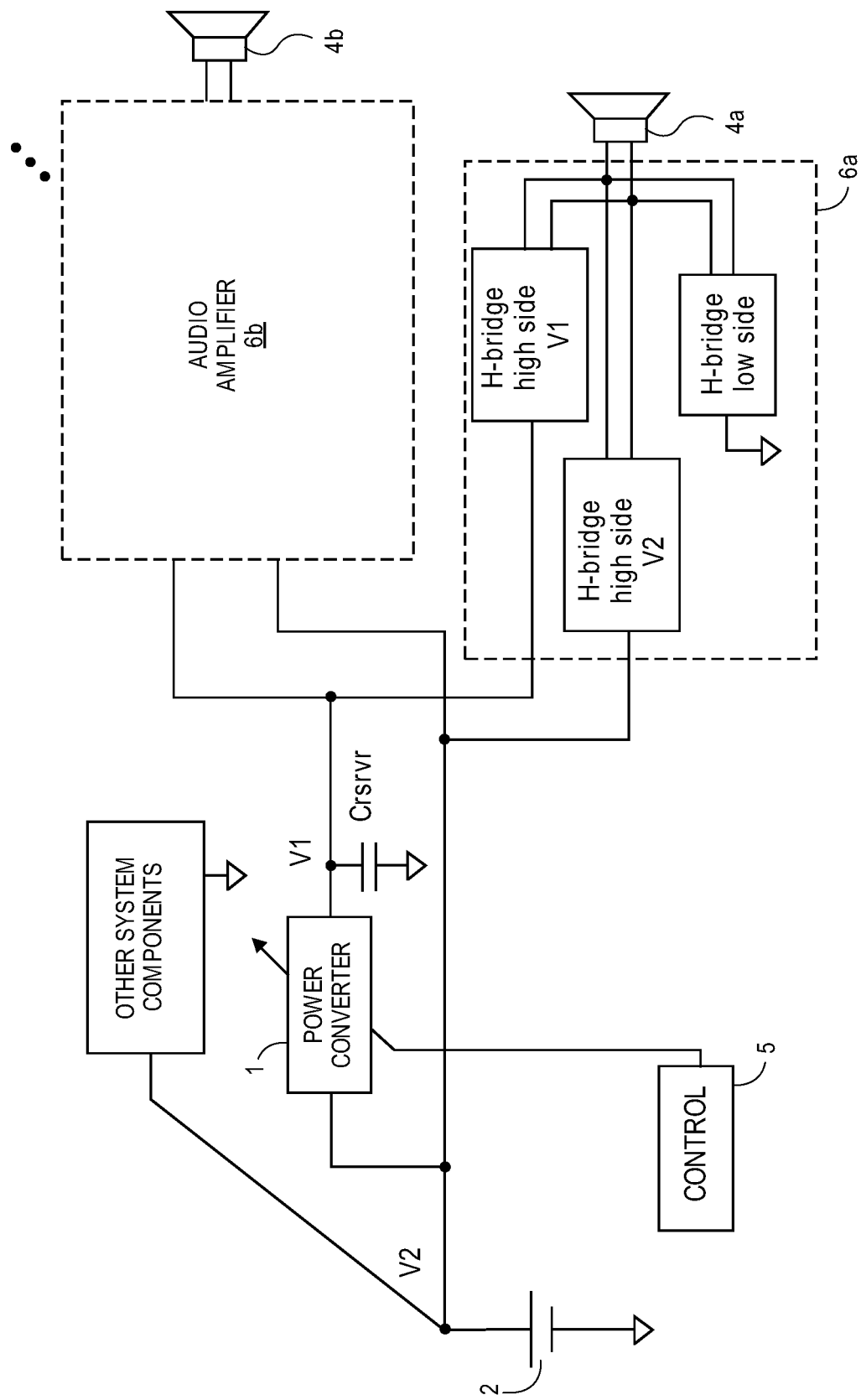
FIG. 1 is a combined block diagram and circuit schematic of an audio amplifier subsystem as part of a battery powered system.

FIG. 1 shows a system having a power source 2 that supplies power to several components of the system. The system may be a consumer electronics device, such as tablet computer, a laptop computer, a smartphone, or a desktop computer. The power source 2 may be a power supply circuit that draws power from an external source, e.g., an AC wall outlet, or it may be a battery as shown. The components are tied to the supply rail of the power source 2 and may include, e.g., a display subsystem, a system on a chip, a graphics processing unit, an RF over the air communications subsystem, etc., and notably an audio amplifier system (subsystem). In one instance, some or all of the components are each allocated a respective, fixed power budget, in order to avoid overloading the power source 2 during high performance operation, which could cause brownouts that induce component shut downs.

The audio amplifier subsystem includes a power converter 1 having an input current limit or input power limit (generically referred to here as "input limit"), on current or power that the power converter 1 is allowed to draw from the power source 2 through the supply rail having voltage V2. In one instance, the power source 2 is a battery as shown, and the power converter 1 is a boost converter that boosts the input battery voltage V2 to a higher V1. This would be the arrangement of a typical consumer electronics portable device such as a laptop computer or a tablet computer from which greater sound output power than would be possible with the battery directly supplying the audio subsystem is desirable. Note that the power converter 1 in that case may not be a voltage regulator (having a regulated DC output voltage). The converter 1 produces a voltage V1 at its output supply rail, across a parallel coupled energy storage reservoir Crsrvr, and abides by its input limit even when attempting to replenish the reservoir Crsrvr during which the voltage V1 may sag significantly.

In other instances, the power source 2 need not be a battery and instead could be a power supply circuit that is providing its power from an AC wall mains outlet, as in for example a desktop computer. The power converter 1 in those instances might not be a boost converter and could for example be a step down converter.

The audio amplifier subsystem also has an audio amplifier 6 which could be one or more amplifiers 6a, 6b, ... each being configured or arranged to draw its supply power alternately, or one at a time, i) from the power source 2 bypassing the power converter 1 and ii) from the power source 2 via the power converter 1. As an example, the figure shows the audio amplifier 6 as having a modified H-bridge that is also referred to here as a Y-bridge, having a first H-bridge high side (coupled to V1 or the output of the power converter 1), a second H-bridge high side (coupled to V2 while bypassing the power converter 1) and a shared H-bridge low side. The amplifier 6 contains circuitry (not shown) that controls the opening and closing of the transistor based switches that make up the modified H-bridge to yield a class D amplifier that amplifies an input audio signal (not shown in FIG. 1) and drives a respective speaker driver 4 to produce sound (e.g., speech, music.) This particular example of the amplifier 6 is shown in detail in FIG. 3 described further below. But it should be noted that other audio amplifier designs are possible, that can amplify an audio signal to drive the same load (speaker driver 4) while being configured in either of at least two operating modes having different supply voltages V2 and V1, e.g., one that has two complete H-bridges rather than the one shown in FIG. 1 which has a shared low side.

Still referring to FIG. 1, the amplifier subsystem also has a control circuit 5 that determines a load of the audio amplifier 6 for when the amplifier is drawing power from the power source (bypassing the power converter 1.) On that basis, it adjusts the input limit of the power converter while the audio amplifier 6 is drawing its supply power from the power source 2 bypassing the power converter 1. The determined load may have been previously estimated or measured in for example a laboratory and then stored in memory of the control circuit 5, as for example an estimate of the average output power of the amplifier 6 while driving an expected speaker driver 4a and while drawing its supply power from the power source V2 (bypassing the power converter 1). Alternatively, the load may be determined in real-time by making various measurements of the amplifier 6, as discussed further below.

For improved accuracy, the control circuit 5 determines an amount of current or power that is drawn by the audio amplifier 6 and that bypasses the power converter 1. This determination may be based on the amplifier load and by applying an efficiency factor of the audio amplifier 6 (e.g., that takes into account switching losses of the H-bridge transistor switches as part of a class D amplifier topology.) The control circuit 5 then lowers the input limit of the power converter 1 based on this determined current or power. By repeatedly doing so during audio playback at a sufficiently frequent rate, the amplifier subsystem can remain within its assigned power budget or current budget, despite frequent instances where the audio amplifier 6 is drawing its supply power from the power source 2 while bypassing the power converter 1 and the power converter 2 is separately charging the energy reservoir Crsrvr at its input limit.

Figure 2:
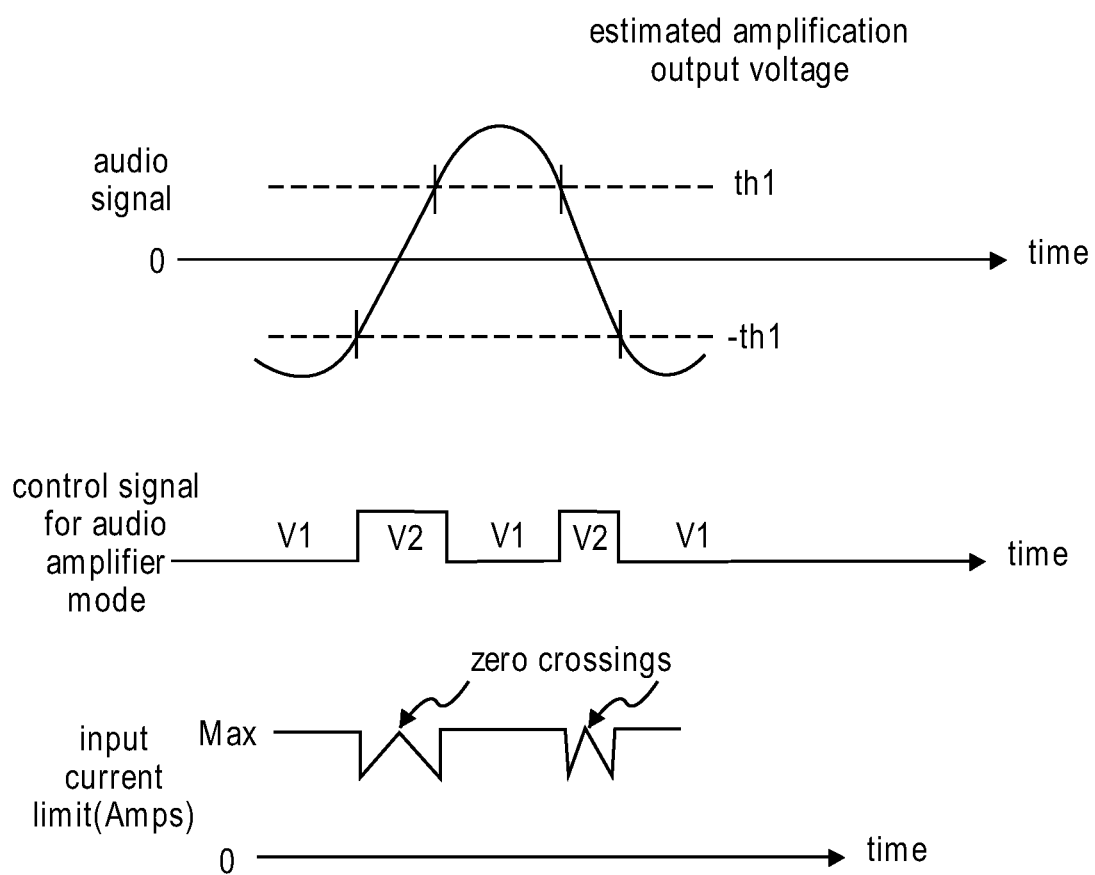
FIG. 2 is shows a snap shot of the waveforms for an audio signal, an amplifier mode control signal, and an input current limit or input power limit.

Turning now to FIG. 2, this shows a snap shot of the waveforms for an audio signal during playback, an amplifier mode control signal, and an input current limit or input power limit (input limit) used to explain how one instance of the subsystem in FIG. 1 could operate. The audio signal shown may be an estimated amplifier output voltage or it may be the unamplified input voltage. The control signal governs the mode of operation of the amplifier, including at least two operating modes having different supply voltages V2 and V1, respectively. In this particular example, the control signal is a binary decision in that it governs configuring between two modes, but in other instances the control signal may be more granular and select one of three or more modes (e.g., three different supply voltages). Finally, the input limit value (here, as an input current limit in Amperes) changes from a nominal value (e.g., a maximum value) in response to the amplifier mode control signal.

Operation of the amplifier subsystem in the context of FIG. 2 may be as follows. A threshold th1 is determined for transitioning the amplifier between V1 and V2, where the audio signal is compared to this threshold and depending on the results of that comparison the control signal asserted or de-asserted as shown. As a particular example, consider the case where V1>V2 as enabled by the power converter 1 being a boost converter that is boosting V2 which is a battery voltage. In that example, the rule may be that when the audio signal amplitude is high (more positive than th1 or more negative than −th1), the amplifier should be configured to operate in a higher voltage mode, here its supply voltage being V1. And when the audio signal amplitude is low (less positive than th1 or less negative than −th1), the amplifier should be configured to operate in a lower voltage mode, here its supply voltage being V2. With that in mind, the variation in the input limit is instructive:

A) when the audio signal is getting smaller (moving toward its zero level) and crosses the threshold −th1 as shown, the input limit starts to become smaller (e.g., abruptly, as shown) by an amount determined as explained above;

B) then, as the audio signal continues to get smaller and moves even closer to zero, the input limit is raised back up towards its nominal level (e.g., gradually, as shown) until there is a zero crossing (by the audio signal), which is consistent with the idea that at zero signal input the amplifier load is essentially zero and hence at that point there is no need to reduce the input limit of the boost converter;

C) then, as the audio signal rises above zero and is getting larger (moving away from its zero level), the input limit is decreased (e.g., gradually, as shown); and D) then, when the audio crosses th1 as shown, the input limit is raised back to its nominal level (e.g., abruptly as shown in this example).

The above-described sequence A-D covers the time interval during which the amplifier mode control signal is asserted to indicate that the amplifier should operate in the V2 supply voltage mode (lower voltage mode.) In the intervals shown in FIG. 2 where the control signal is not asserted, the amplifier should operate in the V1 supply voltage mode (higher voltage mode.) The input limit is thus varied in this manner responsive to the audio signal during playback, which enables fine grained control of the total power draw by the audio amplifier subsystem, on the power source 2 (here, a battery). Note that when adjusting the input limit of the power converter during the V2 intervals shown, the control circuit could apply attack, hold or release dynamics to shape how the input limit is changed as a function of time.

The threshold th1/−th1 for transitioning the audio amplifier between its different supply voltage modes could be set to any suitable value. For example, the threshold can be a constant signal level corresponding to a fixed voltage, e.g., transition to a higher voltage supply if amplifying the present portion of the audio signal would require more than 1 Volt from the battery. As another example, the threshold could be a constant signal level that corresponds to a percentage (fraction) of the present battery voltage, e.g., transition to a higher supply voltage if amplifying the present portion of the audio signal would require more than 75% of the present battery voltage. The amplifier output voltage may be computed based on knowledge of a gain of the amplifier (e.g., a fixed gain) and of course the digital audio input signal being amplified. Thus, and said more generally, a control circuit configures the audio amplifier into a first mode of operation and a second mode of operation (one at a time, not simultaneously) based on an amplifier input signal or based on an amplifier output signal indicating an amplifier supply voltage need (relative to a specified threshold representing a fixed voltage or a fraction of a battery voltage.) Note that the amplifier output signal may be the output of a voltage sense analog to digital converter (ADC) that is measuring the amplifier output voltage (see FIG. 3, Vsense provided by V ADC which is coupled to the load 4 of the amplifier, e.g., a class D Y-bridge).

Figure 3:
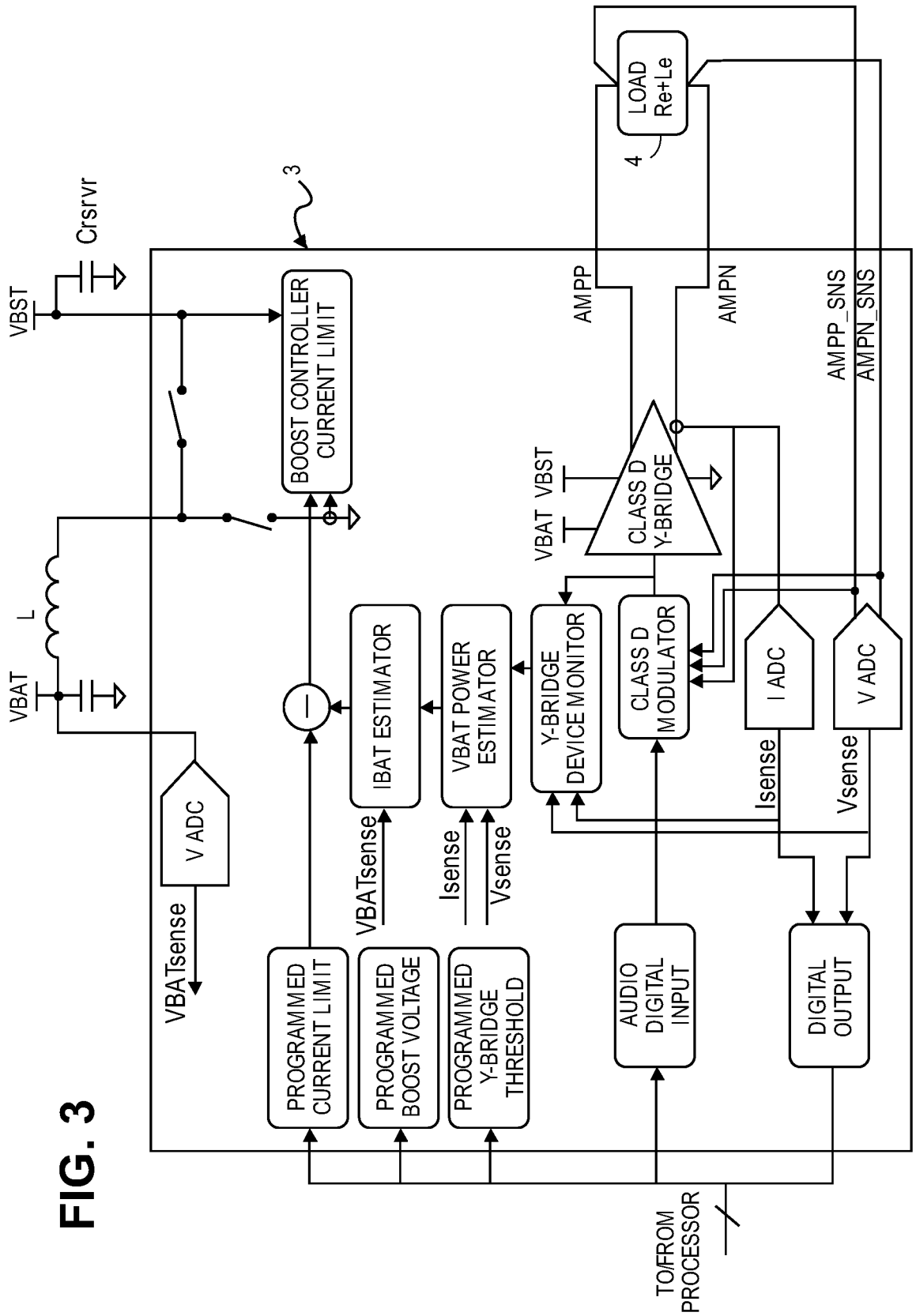
FIG. 3 is a combined block diagram and circuit schematic of an example audio amplifier boost converter circuit.
Figure 4:
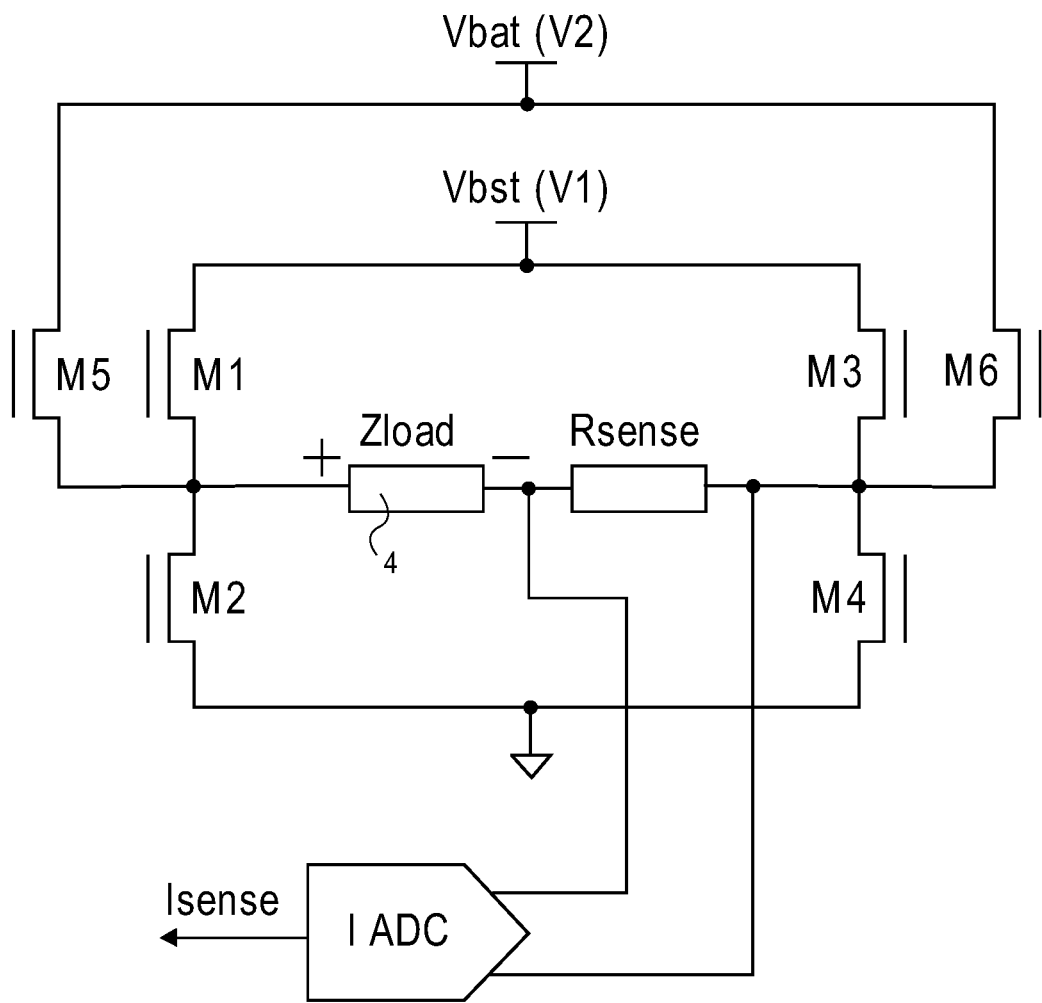
FIG. 4 is a circuit schematic of a modified H-bridge having two high sides that are coupled to different supply rails and that share a single low side.

FIG. 3 is a combined block diagram and circuit schematic of an example audio amplifier boost converter circuit 3 having a control circuit that is configured to estimate current or power drawn by each of one or more audio amplifiers, in this case a class D Y-bridge such as shown in FIG. 4. The amplifier has at least two modes of operation, corresponding to at least two supply voltage rails which are coupled to Vbat and Vbst, respectively. A boost converter controller implements a variable input limit of current or power to the boost converter which produces Vbst. In this example the boost converter controller controls the opening and closing of two transistor switches as shown that are coupled to an inductor node (to which an inductor L is directly coupled as shown) and an energy reservoir node (to which an energy reservoir Crsrvr is directly coupled as shown), respectively. This is a typical boost converter switch mode power supply topology; other power converter topologies are of course possible, including for examples ones that use a charge pump technique to boost Vbat up to Vbst.

There are one or more audio amplifiers each to amplify a respective audio signal, coming from a processor (not shown), Each amplifier is configurable into i) a first mode of operation in which the amplifier is drawing power from the battery node Vbat, and ii) a second mode of operation in which the amplifier is drawing power from the boost converter node, Vbst. An example is the modified H-bridge, or Y-bridge, depicted in FIG. 4. This amplifier design is a modified H-bridge having i) first and second high side switches M1, M3 coupled to first and second output nodes, respectively, at one end, and at another end to an output of the power converter V1 (here, Vbst), ii) third and fourth high side switches M5, M6 that are also coupled to the first and second output nodes, respectively, at one end, and at another end to an output of the power source V2 (here, Vbat) bypassing the power converter, and iii) first and second low side switches M2, M4 also coupled to the first and second output nodes, respectively, at one end, and at another end to a power supply return node (here, ground). Note that the power supply return node need not be at ground (zero volts) but instead could be tied to another suitable voltage source.

Referring back to FIG. 3, the audio signal arrives in digital form from the processor (not shown) into a buffer or register (Audio digital input) before being analyzed by a class D modulator which controls the transistor switches of the amplifier, e.g., to achieve a desired gain or amplification of the audio signal across the load 4 (e.g., a loudspeaker driver). In addition, control circuitry in FIG. 3 (not shown) is responsible for configuring the amplifier (e.g., the Y-bridge of FIG. 4) between its at least two modes of operation, using for example the threshold technique described above in paras. A-B. The threshold (e.g., th1/−th1 described above) may be programmed into a register (programmed Y-bridge threshold).

The current in the load 4 may be sensed by an Isense I ADC, e.g., as a voltage across Rsense which is coupled in series with the load Zload as sheen in FIG. 4. The amount of power drawn by the amplifier is determined (by Vbat Power Estimator) based on i) measuring voltage across the current-sensing resistor that is coupled in series with the load 4 and ii) previously determined or stored amplifier gain and load resistance values. This approach does not require measuring the audio amplifier output voltage, although the example in FIG. 3 does also have Vsense available as a measurement of the voltage across the load 4. Once the power has been determined, it may be converted into a current (by Ibat Estimator), based on a measured value of the present battery voltage, Vbatsense (here available from another V ADC as shown.) This becomes the estimated current drawn from the battery, in this mode of operation where the amplifier is being supplied by Vbat directly (bypassing the boost converter), which is then subtracted from a programmed input current limit of the power converter as shown. This adjusted input current limit is then provided to a boost controller current limit circuit. The latter then compares this adjusted input current limit to its sensed input current (obtained by sensing current in this case through the low side switching leg of the boost converter) and responds to the difference by for example adjusting the duty cycle of the low side switching leg.

The above described approach taken by the control circuit in the amplifier circuit of FIG. 3 is to adjust the variable input limit of the boost converter controller according to the estimated current or power drawn by each of the one or more audio amplifiers in the first mode of operation (drawing the power from the battery node.) This ensures that the programmed current limit that effectively represents the power budget assigned to the amplifier subsystem, is not exceeded even during time intervals of quiet playback where the amplifier power draw is relatively low but the boost converter power draw may be relatively high. The amplifier power draw may be low due to the audio signal being closer to its zero level such that the amplifier is configured into its low supply mode of operation being directly powered by the lower voltage, Vbat. The boost converter power draw may be high due to the boost converter replenishing the energy reservoir Crsrvr at the highest permissible current as governed by the boost controller current limit operating the switches of the boost converter. In other words, during quiet intervals of the audio playback, power drawn from the battery node Vbat by the audio amplifier circuit 3 is maintained within a power budget (e.g., as represented by the programmed current limit) assigned to the amplifier circuit 3.

There are variations to the techniques above for determining the electrical load on the amplifier, as part of determining the power drawn by the amplifier from the power source (e.g., Vbat). For instance, a model of frequency dependent load impedance Zload (see FIG. 4) may be assumed or derived using known techniques. In the case of multiple audio amplifiers (coupled to the same power converter and power source outputs), each of the audio amplifiers may have a current mirror for measuring in proportion to amplifier output current; the control circuit estimates the current or power drawn by each of the one or more audio amplifiers based on a measured current of the current mirror of the respective amplifier. In still another variation, the control circuit can estimate frequency dependent load impedance based on a load thermal model, wherein the control circuit estimates the current or power drawn by each of the one or more audio amplifiers based on this estimated frequency dependent load impedance.

While certain aspects have been described and shown in the accompanying drawings, it is to be understood that such are merely illustrative of and not restrictive on the broad invention, and that the invention is not limited to the specific constructions and arrangements shown and described, since various other modifications may occur to those of ordinary skill in the art. For example, while FIG. 3 depicts the high side and low side transistor-based switches as metal oxide semiconductor field effect transistors, other types of transistor-based switches may be used in different applications. The description is thus to be regarded as illustrative instead of limiting.

What is claimed is:

1. An audio amplifier system comprising:
a power converter having an input current limit on current or input power limit on power that the power converter is allowed to draw from a power source that comprises a battery voltage, the power converter to provide a boosted voltage across an output capacitor;
an audio amplifier arranged to draw its supply power one at a time i) from the power source bypassing the power converter and ii) from the power source via the power converter; and
a control circuit to determine a load of the audio amplifier and based on the determination adjust the input current limit or input power limit of the power converter while i) the audio amplifier is drawing its supply power at the battery voltage from the power source bypassing the power converter and ii) the boosted voltage across the output capacitor is higher than the battery voltage.

2. The audio amplifier system of claim 1, wherein: the audio amplifier comprises a H-bridge.

3. The audio amplifier system of claim 1, wherein the control circuit further determines an amount of supply current or supply power that is drawn by the audio amplifier, wherein the determination is based on the load determined by the control circuit, and wherein the control circuit lowers the input current limit or input power limit of the power converter based on the determined supply current or supply power of the audio amplifier.

4. The audio amplifier system of claim 3, wherein the amount of power drawn by the audio amplifier from the power source is determined based on i) measuring voltage across a current-sensing resistor that is coupled in series with a load of the amplifier and ii) previously determined or stored amplifier gain values and amplifier load resistance values.

5. The audio amplifier system of claim 3, wherein the amount of power drawn by the audio amplifier from the power source is determined based on i) measuring amplifier output voltage, and ii) previously determined or stored values for amplifier gain and amplifier load resistance.

6. The audio amplifier system of claim 3, wherein the amount of power drawn by the audio amplifier from the power source is determined based on a model of frequency dependent amplifier load impedance.

7. The audio amplifier system of claim 1, wherein when adjusting the input current limit or input power limit of the power converter, the control circuit applies attack, hold or release dynamics.

8. The audio amplifier system of claim 1 wherein the power source comprises a battery, and wherein the control circuit adjusts the input current limit or input power limit of the power converter so that total supply power or total supply current drawn from the battery by the audio amplifier system remains within a total current budget or a total power budget.

9. An audio amplifier circuit comprising:
a boost converter controller having a variable input limit of current or power;
one or more audio amplifiers to amplify an audio signal, each configurable into i) a first mode of operation in which the amplifier is drawing power from a battery node and into n) a second mode of operation in which the amplifier is drawing power from a boost converter node; and
a control circuit configured to estimate supply current or supply power drawn by each of the one or more audio amplifiers while in the first mode of operation drawing power from the battery node,
wherein the control circuit is configured to adjust the variable input limit of the boost converter controller according to the estimated supply current or supply power drawn by each of the one or more audio amplifiers in the first mode of operation drawing supply power from the battery node which is at a battery voltage while the boost converter is producing a boosted voltage, across an output capacitor, that is higher than the battery voltage, so as to maintain power drawn from the battery node by the audio amplifier circuit within a power budget assigned to the amplifier circuit and during audio playback.

10. The audio amplifier circuit of claim 9, further comprising:
the control circuit to configure each of the one or more audio amplifiers into the first mode of operation and the second mode of operation based on an amplifier input signal or an amplifier output signal indicating an amplifier supply voltage need, relative to a specified voltage or specified fraction of a battery voltage.

11. The audio amplifier circuit of claim 9, further comprising:
an analog-to-digital converter to measure amplifier output voltage, wherein the control circuit estimates the supply current or supply power drawn by each of the one or more audio amplifiers based on the measured amplifier output voltage.

12. The audio amplifier circuit of claim 11, further comprising:
an analog-to-digital converter to measure current through a current sense element in series with a speaker as an amplifier load, wherein the control circuit estimates the supply current or supply power drawn by one or more of the audio amplifiers based on measured current through the current sense element.

13. The audio amplifier circuit of claim 9 further comprising an externally programmable register to store a threshold that is used to determine when to configure the audio amplifier into the first mode or into the second mode, based on comparison of the audio signal and the threshold.

14. A method of operating an audio amplifier system, comprising:
producing power at a greater voltage than provided by a power source, by a power converter that is drawing power from the power source, wherein the power converter has a variable input current limit or a variable input power limit;
configuring one or more audio amplifiers into i) drawing their supply power from the power source bypassing the power converter and ii) drawing their supply power from the power converter, according to audio signal amplitude;
determining a load of each of the one or more audio amplifiers, wherein the load is determined for when the amplifier is drawing its supply power from the power source bypassing the power converter; and
adjusting the variable input current limit or the variable input power limit of the power converter in accordance with the determined load while i) the one or more audio amplifiers are drawing their supply power at a battery voltage from the power source and at the same time ii) the power converter is producing a boosted voltage that that is higher than the battery voltage.

15. The method of claim 14 wherein adjusting the variable input current limit or the variable input power limit causes a total current or total power drawn from the power source by the audio amplifier system as a whole to be less than or equal to a total current budget or total power budget allocated to the audio amplifier system.

16. The method of claim 14 wherein determining the load comprises measuring load current or load voltage of each audio amplifier, the method further comprising:
determining supply current or supply power drawn by each audio amplifier, based on the determined load and based on an efficiency factor, and wherein the adjusting of the variable limit is based on the determined supply current or supply power drawn by each audio amplifier.

17. The method of claim 14 wherein determining the load comprises:
mirroring output current of each of the one or more audio amplifiers; and
measuring mirrored output current of each of the one or more audio amplifiers.

18. The method of claim 14 wherein determining the load comprises:
determining load impedance of each of the one or more audio amplifiers.

19. The method of claim 14, further comprising:
operating each of one or more class D audio amplifiers, as the one or more audio amplifiers, on a switching cycle basis that is at a higher frequency than audio frequencies, wherein the determining and the adjusting are performed on a same switching cycle basis as the switching cycle basis of each of the one or more class D audio amplifiers.

20. The method of claim 14 wherein each of the one or more audio amplifiers comprises
an H-bridge having i) first and second high side switches coupled to first and second output nodes, respectively, at one end, and at another end to an output of the power converter, ii) third and fourth high side switches coupled to the first and second output nodes, respectively, at one end, and at another end to an output of the power source bypassing the power converter, and iii) first and second low side switches coupled to the first and second output nodes, respectively, at one end, and at another to a power supply return node,
and wherein when drawing supply power from the power source, the first and second high side switches are continuously open while the third and fourth high side switches are being cycled between open and closed, and
when drawing supply power from the power converter, the first and second high side switches are being cycled between open and closed while the third and fourth high side switches are continuously open.

* * * * *